United States Patent [19]

Müller et al.

[11] Patent Number: 5,298,864
[45] Date of Patent: Mar. 29, 1994

[54] NUCLEAR MAGNETIC RESONANCE SPECTROMETER AND METHOD FOR MEASURING THE NUCLEAR MAGNETIC RESONANCE

[75] Inventors: Detlef Müller, Malsch, Fed. Rep. of Germany; Jean-Pierre Coutures, Orleans Cedex, France; Francis Taulelle, Bourg-la-Reine, France; Dominique Massiot, Orléans, France

[73] Assignee: Bruker Analytische MeBtechnik GmbH, Fed. Rep. of Germany

[21] Appl. No.: 836,006
[22] PCT Filed: Aug. 1, 1990
[86] PCT No.: PCT/DE90/00588
§ 371 Date: Mar. 6, 1992
§ 102(e) Date: Mar. 6, 1992
[87] PCT Pub. No.: WO91/18300
PCT Pub. Date: Nov. 28, 1991

[30] Foreign Application Priority Data

Mar. 15, 1990 [FR] France ................. 90 06217

[51] Int. Cl.⁵ ............................................. G01V 3/00
[52] U.S. Cl. ..................................... 324/321; 324/315
[58] Field of Search ............... 324/300, 307, 315, 318, 324/321

[56] References Cited

U.S. PATENT DOCUMENTS 4,940,942 7/1990 Bartuska et al. ..................... 324/307
4,958,126 9/1990 Brevard et al. ..................... 324/307

*Primary Examiner*—Louis Arana
*Attorney, Agent, or Firm*—Claude A. S. Hamrick

[57] ABSTRACT

A nuclear magnetic resonance spectrometer comprises a sample holder being arranged in a constant magnetic field of a predetermined direction. The sample holder comprises a rotor adapted to receive a sample under investigation. The rotor is arranged to rotate the sample about a first axis being inclined to the predetermined direction at an acute angle of, preferably, 54.7°. For heating up the rotor, a laser is provided emitting a laser beam which is directed upon a surface of the rotor. The laser beam is adjustable in intensity by means of a control device.

21 Claims, 1 Drawing Sheet

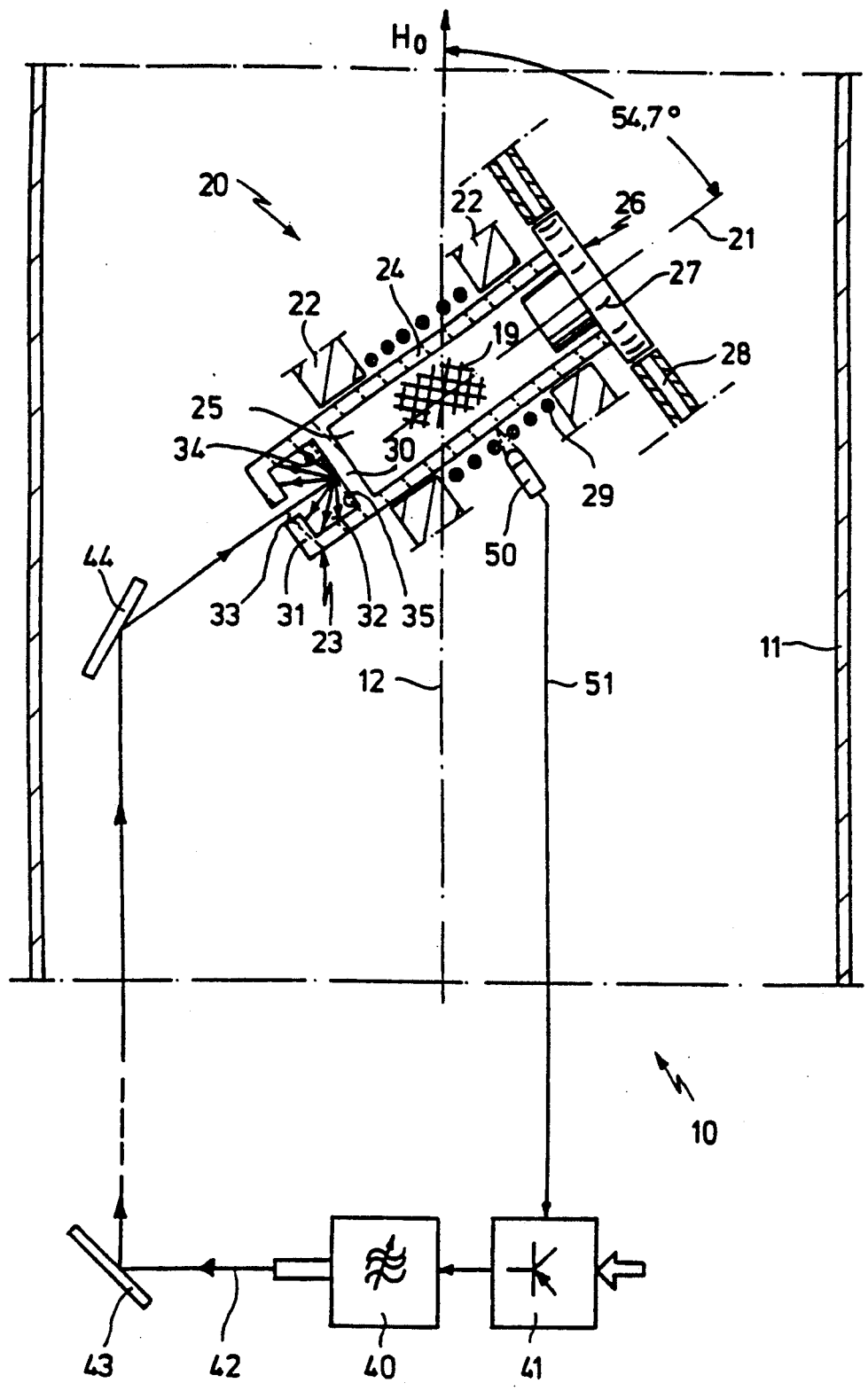

NUCLEAR MAGNETIC RESONANCE SPECTROMETER AND METHOD FOR MEASURING THE NUCLEAR MAGNETIC RESONANCE

The present invention relates to a nuclear magnetic resonance spectrometer comprising a sample holder which is arranged in a constant magnetic field of a predetermined direction and which comprises a rotor adapted to receive a sample, the rotor being arranged to rotate about a first axis which is inclined to the said predetermined direction at an acute angle of, preferably, 54.7°, and means being provided for heating up the rotor.

The present invention further relates to a nuclear magnetic resonance spectrometer comprising a sample holder adapted to receive a sample, and a laser the laser beam of which is directed upon a surface of the sample holder.

Finally, the present invention relates to a method for measuring the nuclear magnetic resonance of a sample, where the sample is heated up during the measurement to a temperature above ambient temperature, by means of a laser beam.

U.S. Pat. No. 4,201,941 describes a nuclear magnetic resonance spectrometer where a sample head comprises a sample holder which in its turn contains a rotor adapted to a receive a sample substance. The rotor of this known nuclear magnetic resonance spectrometer is adapted to rotate about an axis which is inclined relative to the longitudinal axis of the sample head and, thus, relative to the direction of the surrounding constant magnetic field, at an angle of 54.7°, known as the "magic angle". As is generally known, the "magic angle" of 54.7° results from a term of a Legendre's polynomial according to which $3 \cos^2 \Theta - 1 = 0$. If a sample of a solid body is rotated, during a nuclear magnetic resonance measurement, about an axis which is inclined relative to the direction of the constant magnetic field by the "magic angle", then any interactions will be averaged out to the greatest possible degree, whereby a simplified spectrum is obtained.

In the case of the known spectrometer, rotation of the rotor is ensured by a turbine-like arrangement. The rotor is provided for this purpose with a conical section with engraved areas configured in the manner of turbine blades.

The conical section is received in a matching conical receiving opening of a stator which is fixed to the sample head. Inside the conical receiving opening, nozzles are arranged along a circumference for introducing a propellant gas. This arrangement ensures not only a turbine drive for the rotor, but at the same time an air-cushion bearing for the rotor in the receiving opening.

The known nuclear magnetic resonance spectrometer is further equipped, in the immediate neighborhood of the rotor, with a temperature sensor serving for monitoring the temperature of the propellant gas and, thus, of the sample.

Although this fact is not expressly mentioned in U.S. Pat. No. 4,201,941, it has been known in connection with nuclear magnetic resonance spectrometers of the before-mentioned type to control the temperature of the sample via the temperature of the propellant gas, which can be achieved, for example, by heating up the compressed air which is to be blown into the sample head as air cushion and for driving the rotor.

However, this manner of proceeding is connected with the disadvantage that a relatively large quantity of temperature-controlled propellant gas is required for controlling the temperature of the sample, and this in particular in the case of high-temperature measurements on samples, where a correspondingly high volume of high-temperature gas will be required. Further, it is a drawback of this method that due to the before-mentioned manner of controlling the temperature via the propellant gas, all parts of the sample head which get into contact with the gas are automatically heated up as well. This firstly leads to increased energy consumption required for heating up the gas, and further results in the additional serious drawback that the entire area of the sample head will be heated, including those parts for which such heating-up is undesirable. This applies in particular to the receiving coil whose thermal background noise will be greatly increased by a rise in temperature. This is true in particular when the sample head is arranged in a cryostat of a superconductive magnet coil. Finally, it is a disadvantage of the described manner of controlling the temperature of the sample via the propellant gas that, as is generally known, the viscosity of gases, such as air, is largely dependent on temperature. As a result of this fact, any heating-up of the propellant air may lead to rotation problems as the viscosity of the air will rise considerably due to the rise in temperature.

Another considerable disadvantage of the known temperature control resides in the fact that the temperature of the sample must be determined either directly via the temperature of the heated propellant gas, or by direct measurement of the temperature in the sample head. This is extremely difficult in both cases, and in the first case even connected with considerable inaccuracy risks as for technical reasons temperature measurements of the heated propellant gas can be carried out only outside the sample head, i.e. at a considerable distance from the sample holder.

In addition, constant measurements and, if necessary, adjustments or a constant control of the temperature would be required in this case since the propellant case is normally heated up by an electric heating system, and the resulting temperature is of course dependent on the initial temperature of the incoming air, on the air flow rate, and on other factors. The air flow rate, for example, may vary considerably, for example when the before-mentioned temperature-induced variation in viscosity of the propellant gas has to be compensated.

From the U.S. Magazine "Review of Scientific Instruments" (51), Vol. 4, April 1980, pp. 464 to 466, there has been known an electron spin resonance spectrometer where the sample under investigation is arranged on a dish. The dish is held at its bottom by a long rod which, together with the dish, is retained axially inside an insulated glass tube. A laser beam can be directed upon the sample directly from the opposite side of the glass tube. It is further possible with this arrangement to pass liquid nitrogen through the tube in order to quench the sample after the latter has been heated up by the laser beam. The sample temperature can be measured by means of a thermocouple whose output signal is indicated and supplied, via a measuring amplifier, to a temperature control which in its turn is connected to a power supply unit of the laser.

Although it is possible with this known arrangement to heat up the sample without taking recourse to a carrier gas, the accurate adjustment of the temperature requires considerable input in this case, too, and the known device is neither intended, nor suited for recording nuclear magnetic resonance spectra where the sample usually rotates in the magnetic field.

The DE Magazine "BRUKER REPORT 2/1988" describes on pages 9 to 11 a nuclear magnetic resonance spectrometer which enables nuclear magnetic resonance measurments to be carried out on samples at very high temperatures of up to 1,000° Centigrade. In the case of this known arrangement, the sample is freely supported at the lower end of a rotor.

The rotor is arranged to rotate in the magnetic field of a superconductive magnet. A laser beam is directed upon the sample from the bottom of the sample head, through a suitable passage opening.

Although this arrangement indeed enables the sample to be heated up by means of a laser beam during nuclear magnetic resonance measurements performed on a sample which rotates about the vertical axis, temperature control can be implemented only with considerable difficulty.

Another nuclear magnetic resonance spectrometer has been known from FR-OS 1 628 214. In this case, the sample is arranged in the sample space of a magnet, in a fixed vertical-axis sample container. Heating-up is implemented in the case of this known spectrometer also by means of a laser beam which is introduced from the bottom of the sample head, but which in this case impinges upon the sample container so that the sample is heated up only indirectly.

In the case of this known arrangement, the temperature of the sample container, with the sample contained therein, is adjusted to between 400° Centigrade and 1,000° Centigrade by varying the intensity of the laser beam. To this end, a pyrometer is provided for sensing the heat radiated from the upside of the sample container, for processing the values so recorded, and for supplying them to a temperature control.

It appears that this known arrangement is likewise relatively complicated, as regards the adjustment of the temperature of the sample, and in addition the space above the sample container is also employed in the case of this known spectrometer—a fact which may lead to practical difficulties because this space usually is needed for accommodating the mechanical mounting elements for the sample head.

All the known arrangements where the sample, or a sample container, is heated up with the aid of a laser beam, are in addition connected with the following substantial disadvantage:

When the laser beam is directed upon the sample or the sample container, part of the irradiated light is indeed absorbed and converted to heat, but another part is reflected so that secondary light will fall upon those components of the sample head which surround the sample container or the sample as such. This leads to extremely undesirable heating-up of the surrounding components, in particular the RF coil and, consequently, to losses in the signal-to-noise ratio. In addition, heating-up of the air cushions may result in instable rotation conditions.

Now, it is the object of the present invention to improve a nuclear magnetic resonance spectrometer and/or a method of the type described above so that the before-mentioned disadvantages will be avoided.

According to the nuclear magnetic resonance spectrometer mentioned at the outset, this object is achieved according to the invention by a laser whose laser beam is directed upon a surface of the rotor, the laser beam being adjustable in intensity by means of a control device.

The nuclear magnetic resonance spectrometer according to the invention therefore provides the advantage that when the sample is rotated at the "magic angle", measurements can be carried out on samples at high temperatures, without any need for a carrier fluid, and without any components in the neighborhood of the sample getting heated up more than necessary.

According to the nuclear magnetic resonance spectrometer mentioned in the second place, the object underlying the present invention is achieved by the fact that the surface is provided in a cavity of the sample holder, the cavity having only a single access opening. The nuclear magnetic resonance spectrometer, therefore, offers the advantage that while the sample container is heated up in the known manner by means of a laser beam, the energy of the laser beam is utilized almost fully for heating up the sample container and, thus, the sample, whereas the surrounding components are not exposed to direct heating-up by the laser beam.

Finally, the before-mentioned method achieves the object underlying the present invention by the following procedural steps:

Irradiating a laser beam upon a sample container arranged in a sample holder of a nuclear magnetic resonance spectrometer;

varying the intensity of the laser beam and measuring the temperature of the sample container as a function of the intensity of the laser beam;

introducing a sample into the sample container; and adjusting the temperature of the sample by presetting the intensity of the laser.

The before-mentioned procedural steps make appear still another essential advantage of the invention: The arrangement according to the invention is the first to provide a simple possibility to calibrate the temperature control, by directing the laser beam upon a surface of the sample container and/or the rotor which surface is defined as regards its light-absorption properties. One then only has to determine, by a single calibration, the variation of the temperature of the sample container in response to the intensity of the laser beam, and is then in a position to adjust the sample temperature for subsequent tests in a simple way, by presetting the intensity of the laser beam. It goes without saying that to this end the heat capacity per unit volume should conveniently be selected to be much greater than the mean variance of the heat capacities per unit volume of different samples so that the thermal responsivity will vary only insignificantly when the sample is introduced into the sample container.

The desirable degree of definition of the light-absorption properties is achieved most effectively by the use of ceramic materials. In certain preferred embodiments of the invention, therefore, a ceramic surface is provided for irradiating the laser beam, and preferably the entire sample container and/or the entire rotor consists for this purpose of a ceramic material.

Ceramic materials generally have good absorption properties for the $CO_2$ laser wavelengths technically available. In addition, only slight temperature gradients are encountered, due to the generally favorable heat conductivity of ceramic materials, at the envisaged temperatures.

Other advantages of the invention will appear from the specification and the attached drawing. It is understood that the features that have been described before and will be explained hereafter may be used not only in the described combinations, but also in any other combination, or individually, without leaving the scope and intent of the present invention.

BRIEF DESCRIPTION OF THE DRAWING

One embodiment of the invention will now be described in more detail with reference to the drawing. The sole FIGURE shows a schematized, partially sectional side view of one embodiment of the invention.

DETAILED DESCRIPTION OF THE INVENTION

Regarding now the FIGURE, a sample head of a nuclear magnetic resonance spectrometer of conventional design is indicated generally by reference numeral 10. The sample head 10 is delimited to the outside by a tube 11, which is indicated only schematically and whose longitudinal axis defines at the same time a first axis 12 extending in the direction of the constant magnetic field $H_0$ of a magnet system which is not depicted in the figure for the sake of clarity.

In order to enable material properties of a sample 19 to be measured by nuclear magnetic resonance, the sample 19 is arranged in a sample holder indicated generally by 20. The sample holder 20 is designed to extend along a second axis 21 enclosing with the first axis 12 an angle of 54.7°, known as the "magic angle". It is, however, understood that the invention is not limited to the indicated angles, but that other angles can be selected without departing from the scope of the present invention.

The sample holder 20 comprises stationary bearings 22, indicated only schematically in the figure, which serve to rotatably support a rotor 23 in the direction of the second axis 21.

The rotor 23 consists substantially of a small cylindrical tube 24 made from a ceramic material and enclosing an inner space 25 which is intended to receive the sample 19. The tube 24 is closed by a lid 26.

The circumference of the lid 26 is provided with engraved portions 27 configured in the manner of turbine blades. The engraved portions 27 are arranged in the neighborhood of nozzles 28 which serve in the known way for directing a gas flow upon the engraved portions 27 in the circumferential direction, in order to set the rotor 23 into rotation, at a revolution frequency of some KHz.

Further, there is provided an RF coil, indicated by 29, by means of which the RF magnetic field required for nuclear magnetic resonance measurements can be irradiated upon the sample 19.

As can be clearly seen in the figure, a bottom 30 of the tube 24 delimits a chamber 31 which, preferably, is formed integrally with the tube 24 and which also consists of a ceramic material.

The chamber 31 encloses a cavity 32. The cavity 32 communicates with the outside via a single opening 33. Reference numeral 34 indicates an inner surface of the cavity 32. The surface 34 may be provided with a suitable light-absorbing lining 35, or may be roughened.

Below the sample holder 20, there can be seen a laser 40, for example a $CO_2$ laser having a wavelength in the range of 10 $\mu$m and a maximum power output of between 10 and 100 W.

The laser 40 can be adjusted in intensity by means of a control unit 41 which may be integrated in the laser 40.

The laser 40 emits a laser beam 42, which is deflected by means of mirrors 43, 44 in order to enter the cavity 32 through the opening 33, and to impinge upon the surface 34.

The figure shows that when the laser beam 42 hits upon the surface 34, it is reflected, and the reflected light rays impinge upon areas of the surface 43, but are prevented from leaving the chamber 31, the latter being closed on all sides except for the opening 33, as has been described further above. It is now possible, by selecting the surface 34, or a lining 35, in a suitable way, to give the surface 34 particularly diffuse reflection properties in order to prevent even small portions of the irradiated laser light from escaping through the opening 33. The cross-section of the opening 33 is of course selected as small as possible; preferably, the opening 33 is just as big as necessary in view of the cross-section of the laser beam 42, which is preferably focused upon the opening.

Finally, one can see an infrared diode 50 which is arranged near the rotor 23 and which is connected to the control unit 41 via a line 51.

The arrangement operates as follows:

In order to calibrate the temperature control system for the sample 19, the rotor 23 is preferably designed in such a way that its heat capacity per unit volume is considerably greater than the variance of the heat capacities per unit volume of the samples 19 to be measured. The rotor 23 is then introduced into the sample holder 20 either in empty condition or filled with a sample of average properties, and set into rotation by introducing propellant gas through the nozzles 28.

One then switches on the laser 40, and the laser beam 42 is directed, via the mirrors 43, 44, into the opening 33 which, due to its axial arrangement, provides constant access to the cavity 32 during rotation of the rotor 33.

Now, the intensity of the laser beam 42 is varied by adjusting the control unit 41, while measuring at the same time for the purposes of this calibration the temperature to which the rotor 23 is heated up under the effect of the laser beam 42, using for this purpose the infrared diode 50 which, preferably, is focused upon the rotor 23.

At the end of this procedure, a log will be available where the temperature of the rotor and, thus, the temperature of the sample is recorded as a function of the laser output or the setting of the control unit 41, respectively.

If practical measurements are to be carried out later, it is then only necessary to set the control unit 41 to the respective calibrated value which corresponds to a given intensity of the laser beam 42 and, thus, to a defined temperature of the rotor 23 and the sample 19.

It has been mentioned before that, generally, the arrangement described above is independent of the angle at which the rotor 23 is inclined relative to the first axis 12 of the constant magnetic field $H_0$, be it the "magic angle" or any other angle. So, it can be imagined, for example, to arrange the rotor 23 coaxially relative to the first axis 12, as usual for conventional nuclear magnetic resonance measurements, because in this case, too, the sample 19 can be heated up in a controlled way, through irradiation of the laser beam 42 into the cavity 32, and this also during rotation of the rotor 23.

We claim:

1. A nuclear magnetic resonance spectrometer, comprising:
    sample head means having a first axis arranged parallel to a constant magnetic field and including a sample holder means;
    rotor means for receiving a sample under investigation, said rotor means being arranged within said sample holder means and being rotatable about a second axis inclined at an acute angle with respect to said first axis, said rotor means having a surface forming a cavity having only one access opening;
    laser means for emitting a laser beam of controlled intensity;
    means for directing said laser beam through said access opening and onto said surface of said rotor means for heating up said rotor means; and
    control means connected to said laser means for setting said laser beam intensity.

2. The spectrometer of claim 1, wherein said acute angle is 54.7°.

3. The spectrometer of claim 1, wherein said surface is a ceramic surface.

4. The spectrometer of claim 3, wherein said rotor means consists essentially of a ceramic material.

5. The spectrometer of claim 1, wherein said surface is provided with a light-absorbing lining.

6. The spectrometer of claim 1, wherein said surface is roughened.

7. The spectrometer of claim 1, wherein said access opening has a cross-section corresponding essentially to a cross-section of said laser beam.

8. The spectrometer of claim 1, wherein said access opening has a cross-section corresponding essentially to a cross-section of a focal point of said laser beam.

9. The spectrometer of claim 1, wherein said control means is connected to a temperature sensor arranged on said sample holder means.

10. The spectrometer of claim 9, wherein said temperature sensor is an infrared diode detecting temperature of said rotor means surface.

11. A nuclear magnetic resonance spectrometer comprising:
    a sample head having a first axis arranged parallel to a constant magnetic field and including
        a sample holder means including rotor means rotatable about a second axis disposed at an acute angle with respect to said first axis, said rotor means having a first cavity formed therein for receiving a sample under investigation and a second cavity formed therein having an interior surface accessible through an access opening, and
        means for rotating said rotor means about said second axis;
    laser means for emitting a laser beam;
    means for directing said laser beam through said access opening and onto said interior surface for heating said rotor means; and
    control means for monitoring the temperature of said rotor means and for controlling the intensity of said laser beam.

12. The spectrometer of claim 11, wherein said access opening has a cross-section corresponding essentially to a cross-section of said laser beam.

13. The spectrometer of claim 11, wherein said access opening has a cross-section corresponding essentially to a cross-section of a focal point of said laser beam.

14. The spectrometer of claim 11, wherein said surface is provided with a light-absorbing lining.

15. The spectrometer of claim 11, wherein said surface is roughened.

16. The spectrometer of claim 11, wherein said surface is a ceramic surface.

17. The spectrometer of claim 16, wherein said rotor means is essentially comprised of a ceramic material.

18. A method for measuring nuclear magnetic resonance of a sample under investigation within a constant magnetic field, wherein said sample is heated up during said measuring to a temperature above ambient temperature, by means of a laser beam, the method comprising the steps of:
    irradiating a laser beam of predetermined intensity upon a sample container arranged in a sample holder of said nuclear magnetic resonance spectrometer;
    varying said laser beam intensity and measuring temperature of said sample container as a function of said laser beam intensity;
    introducing a sample under investigation into said sample container; and
    adjusting said temperature of said sample under investigation by setting said laser beam intensity accordingly.

19. The method of claim 18, comprising the further steps of:
    arranging said sample under investigation along an axis being inclined by an angle of 54.7° with respect to said constant magnetic field; and
    rotating said sample under investigation about said axis.

20. A method for measuring nuclear magnetic resonance of a sample under investigation within a constant magnetic field wherein said sample is heated up during said measuring to a temperature above ambient temperature by means of a laser beam, the method comprising the steps of:
    introducing a sample under investigation into a sample container;
    disposing said sample container within said constant magnetic field;
    rotating said sample container;
    irradiating said sample container with a laser beam to influence the temperature thereof;
    measuring the temperature of said sample container; and
    varying the intensity of said laser beam as a function of the measured temperature to control the temperature of said sample.

21. A method for measuring nuclear magnetic resonance as recited in claim 20 wherein the sample container is rotated about an axis oriented at an angle of substantially 54.7% with respect to the direction of said constant magnetic fields.

* * * * *

UNITED STATES PATENT AND TRADEMARK OFFICE
CERTIFICATE OF CORRECTION

PATENT NO. : 5,298,864
DATED : March 29, 1994
INVENTOR(S) : Müller et al.

It is certified that error appears in the above-identified patent and that said Letters Patent is hereby corrected as shown below:

On the title page, section [30] Foreign Application Priority Date; replace "Mar. 15, 1990" with --May 15, 1990--.

Signed and Sealed this

Ninth Day of August, 1994

Attest:

BRUCE LEHMAN

Attesting Officer

Commissioner of Patents and Trademarks